(12) United States Patent
Jain et al.

(10) Patent No.: US 9,489,098 B2
(45) Date of Patent: Nov. 8, 2016

(54) METHOD, APPARATUS AND SYSTEM FOR LEVEL SHIFTING OF COMMON MODE VOLTAGE FROM INPUT TO OUTPUT FOR CAPACITIVE FEEDBACK TRANSIMPEDANCE AMPLIFIER

(71) Applicant: Texas Instruments Incorporated, Dallas, TX (US)

(72) Inventors: Karan Singh Jain, Dallas, TX (US); Susan Ann Curtis, Allen, TX (US); Harish Venkataraman, Wylie, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 32 days.

(21) Appl. No.: 14/642,602

(22) Filed: Mar. 9, 2015

(65) Prior Publication Data

US 2015/0256136 A1 Sep. 10, 2015

Related U.S. Application Data

(60) Provisional application No. 61/949,391, filed on Mar. 7, 2014.

(51) Int. Cl.
| | |
|---|---|
| *G06F 3/045* | (2006.01) |
| *G06F 3/044* | (2006.01) |
| *H03F 1/02* | (2006.01) |
| *G06F 3/047* | (2006.01) |
| *G09G 5/00* | (2006.01) |
| *H03F 3/45* | (2006.01) |

(52) U.S. Cl.
CPC ............... *G06F 3/044* (2013.01); *G06F 3/047* (2013.01); *G09G 5/003* (2013.01); *H03F 1/0205* (2013.01); *H03F 3/45475* (2013.01); *G09G 2300/0404* (2013.01); *H03F 2200/135* (2013.01); *H03F 2200/144* (2013.01); *H03F 2200/555* (2013.01); *H03F 2203/45101* (2013.01); *H03F 2203/45138* (2013.01); *H03F 2203/45526* (2013.01); *H03F 2203/45528* (2013.01)

(58) Field of Classification Search
CPC .......... H03F 3/04; G06F 3/047; G09G 5/003
USPC .......................... 345/173, 174; 324/457, 602
See application file for complete search history.

(56) References Cited

U.S. PATENT DOCUMENTS

| | | | |
|---|---|---|---|
| 8,810,249 B2* | 8/2014 | Cehelnik | G06F 3/017 324/457 |
| 2012/0037709 A1* | 2/2012 | Cloutier | G06K 19/06206 235/488 |
| 2012/0086670 A1* | 4/2012 | Teil | G06F 3/045 345/174 |

*Primary Examiner* — Calvin C Ma
(74) *Attorney, Agent, or Firm* — Frank D. Cimino

(57) ABSTRACT

A circuit for a level shifting of common mode voltage. The circuit includes a first amplifier, wherein the input of the first amplifier is coupled to a voltage source and another input of the first amplifier is coupled 2.5v, feedback resistor, $R_{fb}$, and feedback capacitor, $C_{fb}$, connected coupled to the voltage source, wherein other side of feedback resistor is coupled between two resistors, R2 and R2', and wherein the other side of the feedback capacitor is coupled between R2' and the output of the first amplifier, R2 is connected to $V_{bias}$ from one side and $R_{fb}$ and R2' from the other, R2' is connected to $R_{fb}$ and R2 from one side and $C_{fb}$ and output of the first amplifier from the other side, another resistor, R1, is connect to the output of the first amplifier, $C_{fb}$ and R2' from one side and R1', yet another resistor, and input of amp2 from the other, a second amplifier, Amp2, is connected to the R1 and R1' at one input and 1.5v at the other input, and wherein the output of the second amplifier is connected to R1', and R1' connects to one input of the second amplifier and the output of the second amplifier.

4 Claims, 2 Drawing Sheets

METHOD, APPARATUS AND SYSTEM FOR LEVEL SHIFTING OF COMMON MODE VOLTAGE FROM INPUT TO OUTPUT FOR CAPACITIVE FEEDBACK TRANSIMPEDANCE AMPLIFIER

CROSS REFERENCES TO RELATED APPLICATIONS

This application claims priority from U.S. Provisional Patent Application No. 61/949,391 filed on Mar. 7, 2014, which is hereby incorporated by reference in its entirety.

BACKGROUND OF THE INVENTION

1. Field of the Invention

Embodiments of the present invention generally relate to a method, apparatus and system for touch screen processing. More specifically, to a level shifting of common mode voltage from input to output for capacitive feedback transimpedance amplifier 2. Description of the Related Art In a touch screen's amplifier configuration, the input of amplifier is capacitive. However, the amplifier configuration is required to be held at DC voltage different than output of the amplifier. As a result, a lot of DC current is wasted, which is inefficient, or another analog stage of amplifier is required, which comes at a cost of adding another source of noise to the system and its associated complexity.

Therefore, there is a need to hold the DC voltage without the extra stage or wasted DC power.

SUMMARY OF THE INVENTION

Embodiments of the present invention relate to a circuit for a level shifting of common mode voltage. The circuit includes a first amplifier, wherein the input of the first amplifier is coupled to a voltage source and another input of the first amplifier is coupled 2.5v, feedback resistor, $R_{fb}$, and feedback capacitor, $C_{fb}$, connected coupled to the voltage source, wherein other side of feedback resistor is coupled between two resistors, R2 and R2', and wherein the other side of the feedback capacitor is coupled between R2' and the output of the first amplifier, R2 is connected to $V_{bias}$ from one side and $R_{fb}$ and R2' from the other, R2' is connected to $R_{fb}$ and R2 from one side and $C_{fb}$ and output of the first amplifier from the other side, another resistor, R1, is connect to the output of the first amplifier, $C_{fb}$ and R2' from one side and R1', yet another resistor, and input of amp2 from the other, a second amplifier, Amp2, is connected to the R1 and R1' at one input and 1.5v at the other input, and wherein the output of the second amplifier is connected to R1', and R1' connects to one input of the second amplifier and the output of the second amplifier.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The proposed solution provides for a way of providing DC feedback which leads the amplifier to think it is regulating the same voltage both at the input and the output. The solution uses a common mode DC shift current inside the feedback loop, which maintains a different DC voltage at the output with respect to the input of the amplifier.

Figure 1:
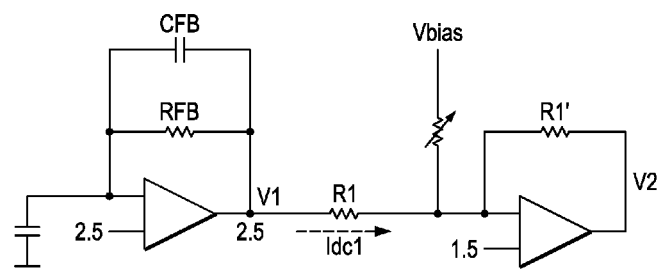
FIG. 1 is an embodiment of a circuit schematic of the prior art.
Figure 2:
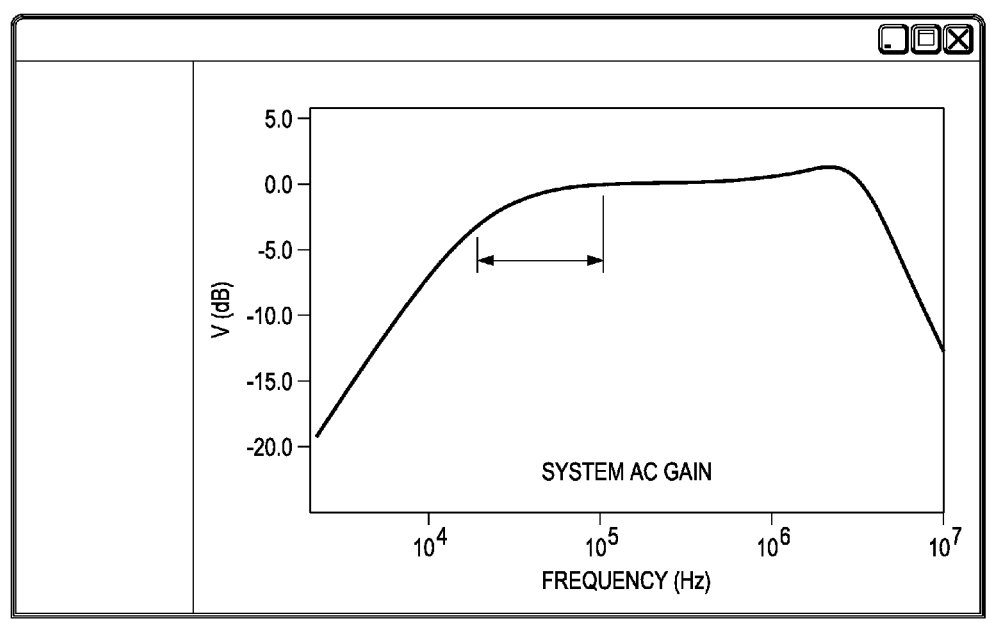
FIG. 2 is an embodiment of a graph depicting performance of the prior art.

FIG. 1 is an embodiment of a circuit schematic of the prior art. The circuit comprises ample 1, amp 2, $R_{fb}$, $C_{fb}$, R1, R1' and switch S1. The amp 1 receives input from an input voltage source and 2.5 v. The amp1 is connected in series with $R_{fb}$ and $C_{fb}$, where one lead of $R_{fb}$ and $C_{fb}$ is coupled to the voltage source and the other is coupled to the output of amp1. V1 is measures at the output of amp 1 to be 2.5v. R1 is connect in series at the output of amp 1. R1 is coupled to the output of amp1, R1' on one side and R1' and S1 on the other. S1 is coupled to R1, R1' and amp 2 from one side and $V_{bias}$ one the other. R'1 is connected to the input of amp 2, R1 and $V_{bias}$; on the other side, R1' is connected to the output of amp2. Amp2 has input voltage of 1.5 v on one lead and R1, R1' and S1 on the other input lead. The output of amp2 is v2. FIG. 2 is an embodiment of a graph depicting performance of the prior art. The performance of this circuit is shown in the graph of FIG. 2 and is defined as follows:

| Characteristics | Performance |
|---|---|
| DC Power | Idc1 = (2.5 − 1.5)/R1 |
| | If R1 5K ohms → Then Idc1 = 200 uA/Amplifier |
| | If R1 40K ohms → Then Idc1 = 25 uA/Amplifier |
| Output-Dynamic Range | 4 Vpp |
| Area Impact | Require Vbias generation can be used for all the Amps |

Figure 3:
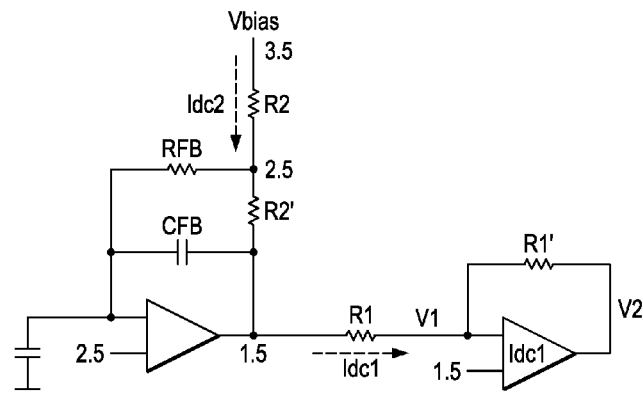
FIG. 3 is an embodiment of a circuit schematic for a level shifting of common mode voltage.
Figure 4:
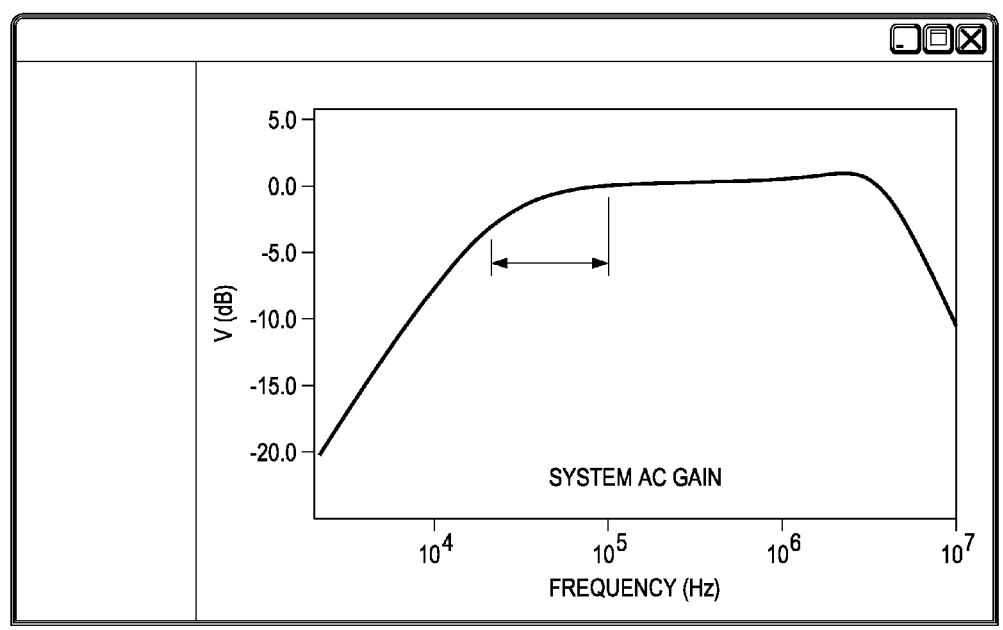
FIG. 4 is an embodiment of a graph depicting performance of the circuit schematic of FIG. 3.

FIG. 3 is an embodiment of a circuit schematic for a level shifting of common mode voltage. The circuit comprises ample 1, amp 2, $R_{fb}$, $C_{fb}$, R1, R1', R2, and R2'. One lead of amp1 is coupled to the voltage source and the other to 2.5v. One lead of $R_{fb}$ and $C_{fb}$ are connected to the voltage source. The other side of $R_{fb}$ is connected between R2 and R2'. R2 is connected to $V_{bias}$ from one side and $R_{fb}$ and R2' from the other. R2' is connected to $R_{fb}$ and R2 from one side and $C_{fb}$ and output of amp1 from the other side. R1 is connect to the output of amp1, $C_{fb}$ and R2' from one side and R1' and input of amp2 from the other. Amp2 is connected to the R1 and R1' at one input, 1.5v at the other input and R1' at its output. R1' connects to one input of amp2 and the output of amp2. FIG. 4 is an embodiment of a graph depicting performance of the circuit schematic of FIG. 3. The performance of this circuit is shown in the graph of FIG. 4 and is defined as follows:

| Characteristics | Comments |
|---|---|
| DC Power | Idc1 = 0;<br>Idc2 = (2.5 − 1.5)/R2 where R2 ~= 100K ohms<br>Then Idc2 = 10 uA/Amplifier |
| Output Dynamic Range | 2 Vpp |
| Area Impact | Require Vbias generation can be used for all the Amps |

The improved solution between FIG. 1 and FIG. 3 does not require an increase DC power or noise of system and is simple and simple to implement.

While the foregoing is directed to embodiments of the present invention, other and further embodiments of the invention may be devised without departing from the basic scope thereof, and the scope thereof is determined by the claims that follow.

What is claimed is:

1. A circuit for a level shifting of common mode voltage, comprising:
   a first amplifier, wherein a first input of the first amplifier is coupled to a voltage source, and a second input of the first amplifier is coupled to 2.5v;
   a feedback resistor $R_{fb}$, and a feedback capacitor $C_{fb}$, coupled to the voltage source, wherein another side of the feedback resistor is coupled between two resistors R2 and R2', and wherein another side of the feedback capacitor is coupled between R2' and an output of the first amplifier;
   wherein R2 is connected to: a bias voltage $V_{bias}$ from one side; and $R_{fb}$ and R2' from another side;
   wherein R2' is connected to: $R_{fb}$ and R2 from one side; and $C_{fb}$ and the output of the first amplifier from the another side;
   another resistor R1, connected to: the output of the first amplifier, $C_{fb}$ and R2' from one side; and yet another resistor R1' and a first input of a second amplifier from another side;
   wherein the second amplifier is connected to: R1 and R1' at the first input of the second amplifier; and 1.5v at a second input of the second amplifier, and wherein an output of the second amplifier is connected to R1'; and
   wherein R1' is connected to: the first input of the second amplifier from one side; and the output of the second amplifier from another side.

2. The circuit for a level shifting of common mode voltage of claim 1, wherein R1 and R1' have the same value.

3. The circuit for a level shifting of common mode voltage of claim 1, wherein R2 and R2' have the same value.

4. The circuit for a level shifting of common mode voltage of claim 1, wherein the circuit is coupled to a touch screen.

* * * * *